(12) United States Patent
Baksh et al.

(10) Patent No.: US 11,789,075 B1
(45) Date of Patent: Oct. 17, 2023

(54) SPLIT-SCAN SENSE AMPLIFIER FLIP-FLOP

(71) Applicant: Advanced Micro Devices, Inc., Santa Clara, CA (US)

(72) Inventors: Nur Mohammad Baksh, Austin, TX (US); Michael Q. Co, Austin, TX (US); Vibhor Mittal, Austin, TX (US); Kedar Karthykeyan, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/853,409

(22) Filed: Jun. 29, 2022

(51) Int. Cl.
*G01R 31/3177* (2006.01)
*G01R 31/3185* (2006.01)
*G01R 31/317* (2006.01)

(52) U.S. Cl.
CPC ... *G01R 31/3177* (2013.01); *G01R 31/31727* (2013.01); *G01R 31/318541* (2013.01); *G01R 31/318552* (2013.01)

(58) Field of Classification Search
CPC ......... G01R 31/3177; G01R 31/31727; G01R 31/318541; G01R 31/318552
USPC ................................. 714/726, 729, 727, 731
See application file for complete search history.

(56) References Cited

U.S. PATENT DOCUMENTS

| | | | |
|---|---|---|---|
| 8,624,632 B2 * | 1/2014 | Bulzacchelli | H03K 3/356139 327/212 |
| 9,606,177 B2 | 3/2017 | Bailey et al. | |
| 9,680,450 B2 | 6/2017 | Bailey | |
| 10,038,429 B1 * | 7/2018 | Narayanan | H03K 3/013 |
| 11,095,274 B1 * | 8/2021 | Baksh | H03K 3/02332 |
| 2003/0200493 A1 * | 10/2003 | Campbell | G01R 31/318572 714/726 |
| 2004/0068640 A1 * | 4/2004 | Jacobson | G06F 1/3203 712/E9.063 |
| 2004/0196082 A1 * | 10/2004 | Pacha | H03K 3/356139 327/215 |
| 2006/0006900 A1 * | 1/2006 | Kinkade | H03K 3/0375 326/16 |
| 2008/0265962 A1 * | 10/2008 | Waldrip | G01R 31/318541 327/202 |
| 2009/0089632 A1 * | 4/2009 | Morein | G11C 29/14 714/719 |
| 2012/0256672 A1 * | 10/2012 | Jiang | H03K 3/356191 327/198 |
| 2014/0154790 A1 * | 6/2014 | Ono | C12Q 1/6869 435/287.2 |

(Continued)

OTHER PUBLICATIONS

Chen et al., Single-Event Performance of Differential Flip-Flop Designs and Hardening Implication, 2016, IEEE, pp. 221-226. (Year: 2016).*

*Primary Examiner* — John J Tabone, Jr.
(74) *Attorney, Agent, or Firm* — Zagorin Cave LLP

(57) ABSTRACT

A method includes generating a functional clock signal, a scan clock signal, and a delayed clock signal based on a control clock signal and a scan enable signal. The method includes precharging or predischarging a differential pair of nodes in a first latch using the delayed clock signal and a voltage on a first power supply node and controlling a second latch using the delayed clock signal. The method includes latching data input by the first latch using the functional clock signal in a functional mode of operation and latching scan data by the first latch using the scan clock signal in a scan mode of operation.

20 Claims, 8 Drawing Sheets

(56) References Cited

U.S. PATENT DOCUMENTS

| | | | | |
|---|---|---|---|---|
| 2014/0176212 A1* | 6/2014 | Kim | ............... | G01R 31/318541 |
| | | | | 327/225 |
| 2014/0210511 A1* | 7/2014 | Bartling | ............... | H03K 19/173 |
| | | | | 326/38 |
| 2014/0210535 A1* | 7/2014 | Bartling | ............. | G11C 14/0072 |
| | | | | 327/199 |
| 2016/0341793 A1* | 11/2016 | Bailey | ............ | G01R 31/318525 |
| 2017/0230041 A1* | 8/2017 | Kato | ...................... | G11C 5/145 |
| 2018/0181193 A1* | 6/2018 | Barn | ................ | H03K 3/356121 |

\* cited by examiner

SPLIT-SCAN SENSE AMPLIFIER FLIP-FLOP

BACKGROUND

Description of the Related Art

In general, synchronous circuits use flip-flops or latches to store data in integrated circuits. Flip-flops are used as building blocks in a variety of sequential logic circuits such as registers. For example, modern microprocessors use pipelining, which is a technique that partitions the processing of an instruction into several smaller sub-tasks, each of which can be performed within one clock cycle. Pipelined microprocessors include dedicated circuitry to perform each sub-task, and different instructions are processed at each subtask in a sequential, or pipelined, fashion. Thus, pipelined microprocessors are able to achieve high effective instruction throughput even though only a portion of any individual instruction is processed per clock cycle in one of the pipeline stages.

Pipelined microprocessors use pipeline registers to store the results of an operation at a particular pipeline stage and provide these results to a subsequent pipeline stage. The speed of a pipelined microprocessor is limited by the amount of time it takes to perform the functions of a pipeline stage and to store the results stably in the pipeline register. Thus, the maximum speed of the microprocessor clock is partially limited by the delay through the pipeline register, and hence the flip-flops that form the pipeline register. In addition, digital logic circuits (e.g., pipelined microprocessors) use a a scan testing technique that tests internal nodes to detect manufacturing defects. Scan testing requires modified flip-flops that can function as stimulus and observation points during a scan test mode of operation and can perform their intended functional role during a normal mode of operation.

In an exemplary embodiment of scan testing, a test controller shifts test data into a serial chain of scan flip-flops and when the data has been properly aligned in the serial chain, a test controller enables the test and measures the response of the circuit. The test controller then shifts the data to an output pin so that it can be compared with a response pattern of a correctly fabricated circuit. Scan testing has become a valuable technique to ensure that complex digital integrated circuits operate properly. However, including scan testing capability in a flip-flop can slow operation of the flip-flop.

Referring to FIGS. 1 and 2, in an embodiment of scan sense amplifier flip-flop 100, during a precharge phase (e.g., clock signal CLK='0'), node S_L and node R_L of latch portion 104 of differential latch circuit 110 are charged to VDD via pre-charging circuit portion 108. In response to the beginning of the evaluation phase (e.g., a rising edge of buffered clock signal CLK), input circuit portion 106 and latching circuit portion 104 discharge to VSS one of those internal nodes, determined by the logical value of data signal D or scan data input signal SDI, while the other of those internal nodes remains charged.

Scan sense amplifier flip-flop 100 provides buffered clock signal CLK, which is based on input clock CP, to differential latch 110, latch 114, and multiplexer 112. Differential master latch circuit 110 includes latching circuit portion 104, input circuit portion 106, and pre-charging circuit portion 108. Buffered clock signal CLK and n-type transistors 142 and 146 cause cross-coupled p-type transistors 124 and 126 and cross-coupled n-type transistors 150 and 152 or cross-coupled n-type transistors 154 and 156 of latching circuit portion 104 to latch input data provided by input circuit portion 106 and pre-charging circuit portion 108. N-type transistors 130 and 140 of input circuit portion 106 provides data signal D via n-type transistors 136 and 132 or scan input signal SI via n-type transistors 138 and 134 to differential pair of nodes S_L and R_L according to the state of scan enable signal SE, which controls n-type transistors 128, 130, 140, and 144. Pre-charging circuit portion 108 pre-charges differential pair of nodes S_L and R_L using p-type transistors 120 and 122, which are coupled to power supply node VDD, in response to buffered clock signal CLK. Multiplexer 112 selectively provides signals on differential pair of nodes S_L and R_L or a version of latched data output signal Q as output data signal Q in response to buffered clock signal CLK. Latch 114 is controlled by buffered clock signal CLK to update inverted data output signal QB via inverter 135 based on the signal on node R_L or data output signal Q.

If scan enable signal SE is inactive (e.g., scan enable signal SE equals '0'), then scan sense amplifier flip-flop 100 captures data signal D in a normal mode of operation. If scan enable signal SE is active (e.g., scan enable signal SE equals '1'), then scan sense amplifier flip-flop 100 captures scan data input signal SI in a scan mode of operation. If the selected input data signal is high (e.g., data signal D in the normal mode of operation or scan data input signal SDI in the scan mode of operation), then as buffered clock signal CLK rises, node S_L discharges, and node R_L stays charged. Latching circuit portion 104 amplifies and latches the differential voltage on node R_L and node S_L, resulting in a stable logic low voltage on node S_L. The logic low voltage on node S_L causes multiplexer 112 to drive output signal Q to a logic high value. If the selected input data signal is low, then as buffered clock signal CLK rises, node R_L discharges, and node S_L stays charged. Latch 114 latches the differential voltage on node S_L and node R_L, resulting in a stable logic high voltage on node S_L. The logic high voltage on node S_L causes multiplexer 112 to provide a logic low output signal Q.

Physical design is focused on reducing delay through critical timing paths. Timing overhead of the sequential elements is a substantial component of these critical timing paths. Failure to limit these timing paths limit a maximum frequency of operating an associated product. While physical designers can reduce delay of the critical timing path by careful gate placement and routing choices, the sequential timing overhead limits reduction in delay. Timing overhead of an exemplary flip-flop is approximately 6~14% of the cycle time of the maximum frequency clock signal of an associated product. Reduction in timing overhead of sequential elements circuit or flip-flop reduces the delay through critical paths and increases the maximum frequency of operating an associated product.

In an embodiment of scan sense amplifier flip-flop 100, evaluation paths 116 and 118 include four transistors between the differential node and ground. Evaluation paths 116 and 118 between node S_L and node R_L, respectively, and ground are critical paths that limit the maximum frequency of operation of the product. Scan sense amplifier flip-flop 100 is a high performing circuit with low timing overhead but the timing overhead is still at 6~7% of clock cycle-time. One source of that timing overhead is the four transistors coupled in series in the pull-down evaluation path. One of those four transistors (e.g., n-type transistor 128 or n-type transistor 144) is dedicated to a scan multiplexer function. A non-scan version of this flip-flop would be faster but is not a viable option for productization. Accordingly, an improved scan flip-flop is desired.

SUMMARY OF EMBODIMENTS OF THE INVENTION

In at least one embodiment, a method includes generating a functional clock signal, a scan clock signal, and a delayed clock signal based on a control clock signal and a scan enable signal. The method includes precharging or predischarging a differential pair of nodes in a first latch using the delayed clock signal and a voltage on a first power supply node and controlling a second latch using the delayed clock signal. The method includes latching data input by the first latch using the functional clock signal in a functional mode of operation and latching scan data by the first latch using the scan clock signal in a scan mode of operation.

In at least one embodiment, a scan flip-flop includes a first latch. The first latch includes a differential pair of nodes and a precharge circuit portion or predischarge circuit portion coupled between the differential pair of nodes and a first power supply node. The precharge circuit portion or predischarge circuit portion is controlled by a delayed clock signal. The first latch includes an input circuit portion coupled between the differential pair of nodes and a second power supply node. The first latch includes a latching circuit portion coupled between the differential pair of nodes and the second power supply node. The input circuit portion and the latching circuit portion are coupled to form normal mode evaluation paths between the differential pair of nodes and the second power supply node and responsive to a functional clock signal and an input data signal and are coupled to form scan mode evaluation paths between the differential pair of nodes and the second power supply node and responsive to a scan clock signal and a scan data input signal. The first latch includes a clock generation circuit configured to generate the functional clock signal, the scan clock signal, and the delayed clock signal based on a control clock signal and a scan enable signal.

In at least one embodiment, a processor includes a first functional circuit, a second functional circuit, and a scan chain coupled to an output of the first functional circuit and to an input of the second functional circuit. Each scan flip-flop of the scan chain includes a first latch circuit. The first latch circuit includes a differential pair of nodes and a precharge circuit portion or a predischarge circuit portion coupled between the differential pair of nodes and a first power supply node and is controlled by a delayed clock signal. The first latch circuit includes an input circuit portion coupled between the differential pair of nodes and a second power supply node. The first latch circuit includes a latching circuit portion coupled between the differential pair of nodes and the second power supply node. The input circuit portion and the latching circuit portion are coupled to form normal mode evaluation paths between the differential pair of nodes and the second power supply node responsive to a functional clock signal and an input data signal, and to form scan mode evaluation paths between the differential pair of nodes and the second power supply node responsive to a scan clock signal and a scan data input signal. Each normal mode evaluation path of the normal mode evaluation paths includes at most three transistors coupled in series between the differential pair of nodes and the second power supply node.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

A technique for improving performance of a scan sense amplifier flip-flop includes reducing the number of transistors in a critical path of the scan sense amplifier flip-flop. The technique eliminates a transistor used by a scan multiplexer from an evaluation path of the scan sense amplifier flip-flop and partitions gating of the input clock signal, thereby maintaining a scan mode of operation and a normal mode of operation of the scan sense amplifier flip-flop. The technique is also applicable to scan sense amplifier flip-flops that incorporate logic functions.

Figure 1:
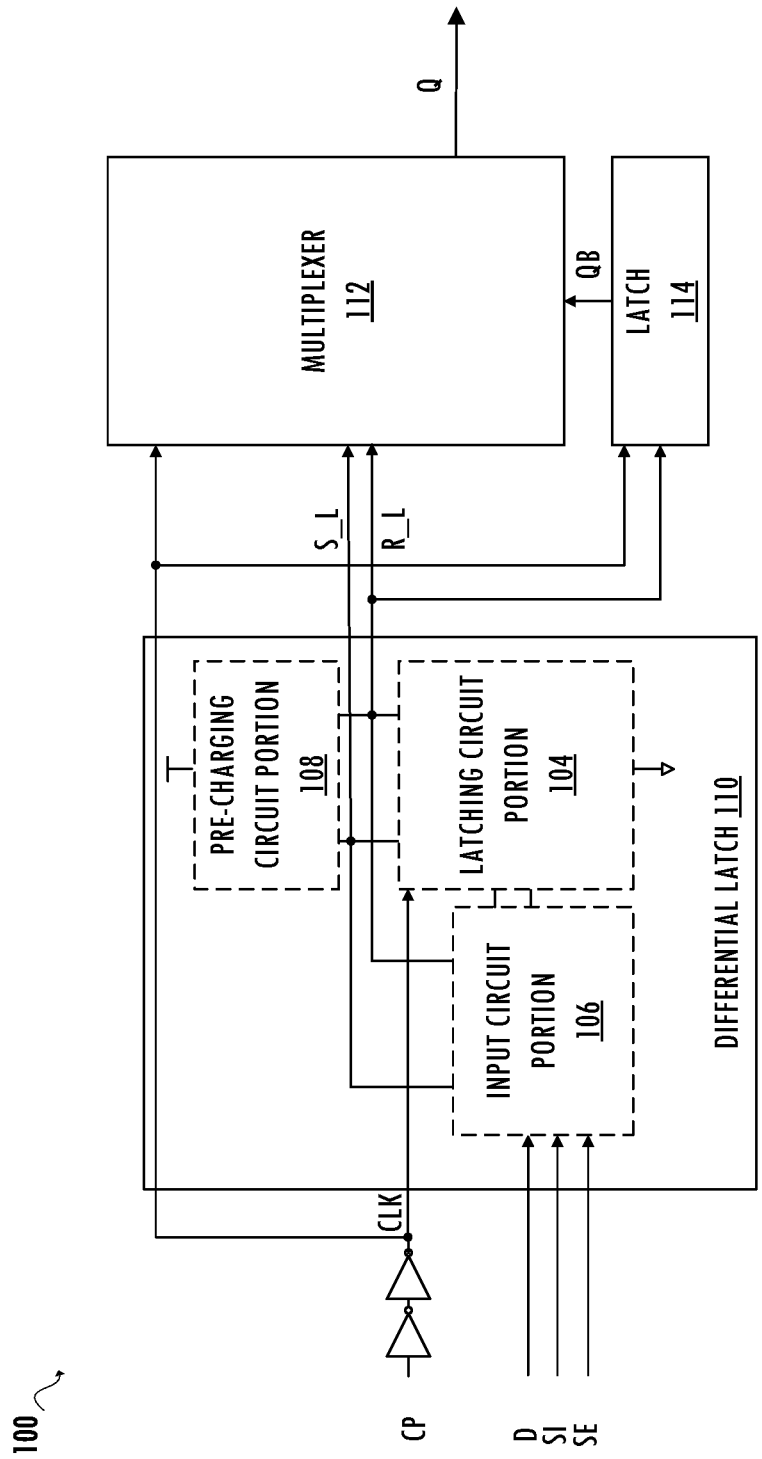
FIG. 1 illustrates a functional block diagram of a scan sense amplifier flip-flop.
Figure 2:
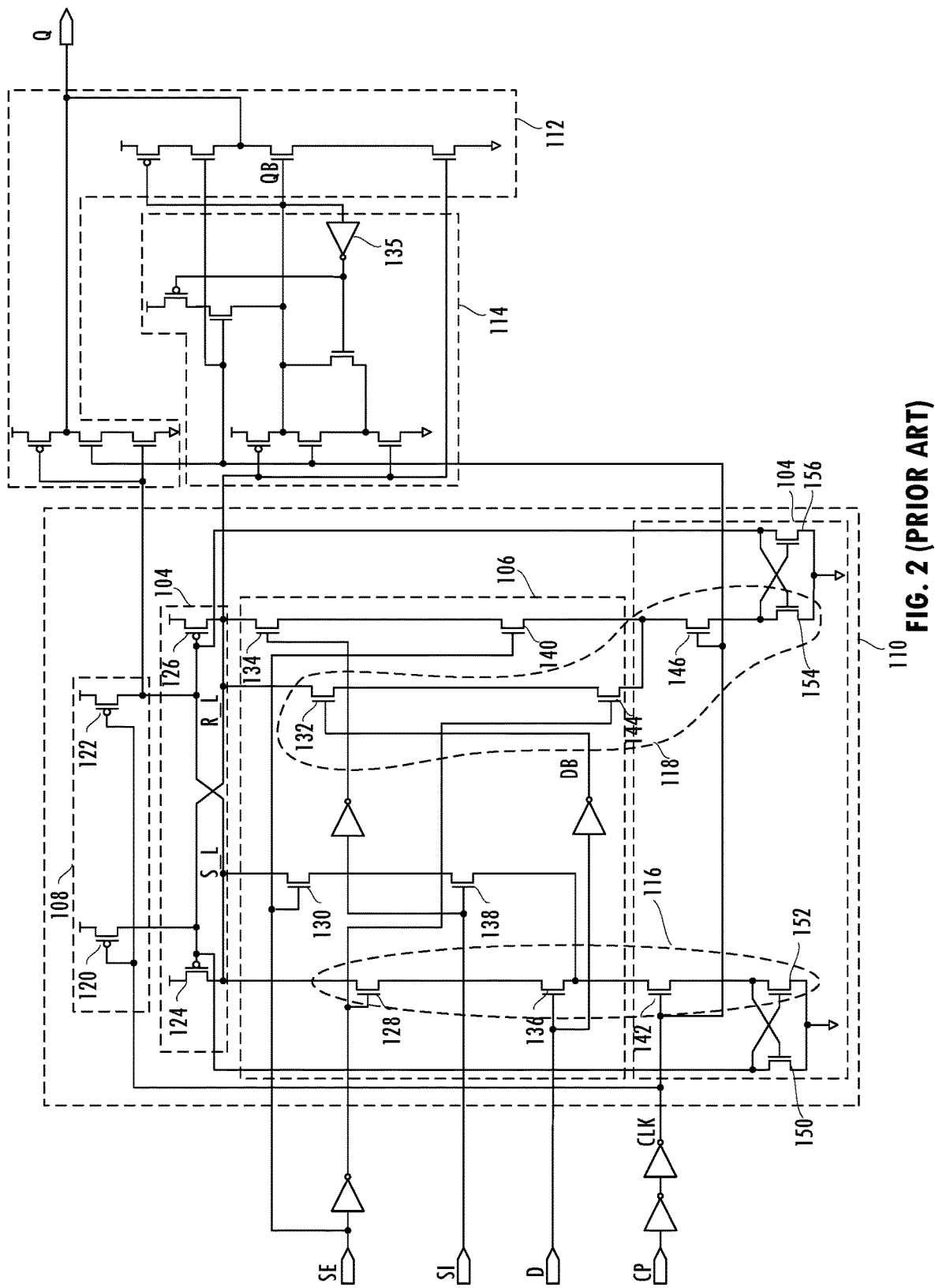
FIG. 2 illustrates an exemplary circuit diagram of the scan sense amplifier flip-flop of FIG. 1

Referring to FIG. 1, scan sense amplifier flip-flop 100 includes four n-type transistors coupled in series to each of nodes S_L and R_L. Each of these nodes have two evaluation paths to power supply node VSS for evaluation. One of those evaluation paths is for a normal mode of operation and the other evaluation path is for a scan mode of operation. Both evaluation paths include four transistors coupled in series. A split-scan sense amplifier flip-flop includes a reduced number of n-type transistors coupled in series in the normal mode path while keeping the scan function intact. The split-scan sense amplifier flip-flop partitions the input clock signal (CP) into two clock signals for the two modes of operation. The split-scan sense amplifier flip-flop generates functional clock FCLK, which is active when scan enable is inactive (e.g., SE='0'), generates scan clock SCLK, which is active when scan enable is active (e.g., when SE='1'), and uses these clocks for the corresponding evaluation (e.g., pull-down) branches.

In at least one embodiment, the split-scan sense amplifier flip-flop delays input clock signal CP (e.g., by two inverters)

to generate delayed clock signal CLKT, which is used for pre-charging S_L and R_L nodes and for the slave latch operation. Delayed clock signal CLKT has a delay that matches functional clock FCLK and scan clock SCLK to avoid race conditions. Since functional clock FCLK and scan clock SCLK are mutually exclusive in the split-scan sense amplifier flip-flop, the mode select transistors 128, 130, 140, and 144 of scan sense amplifier flip-flop 100 are excluded from each branch of the split-scan sense amplifier flip-flop. In at least one embodiment of a split-scan sense amplifier flip-flop, mode select transistors are included in the scan branches to isolate S_L and R_L nodes from a switching scan input pin (SI), thereby improving the timing of the functional branch.

Figure 3:
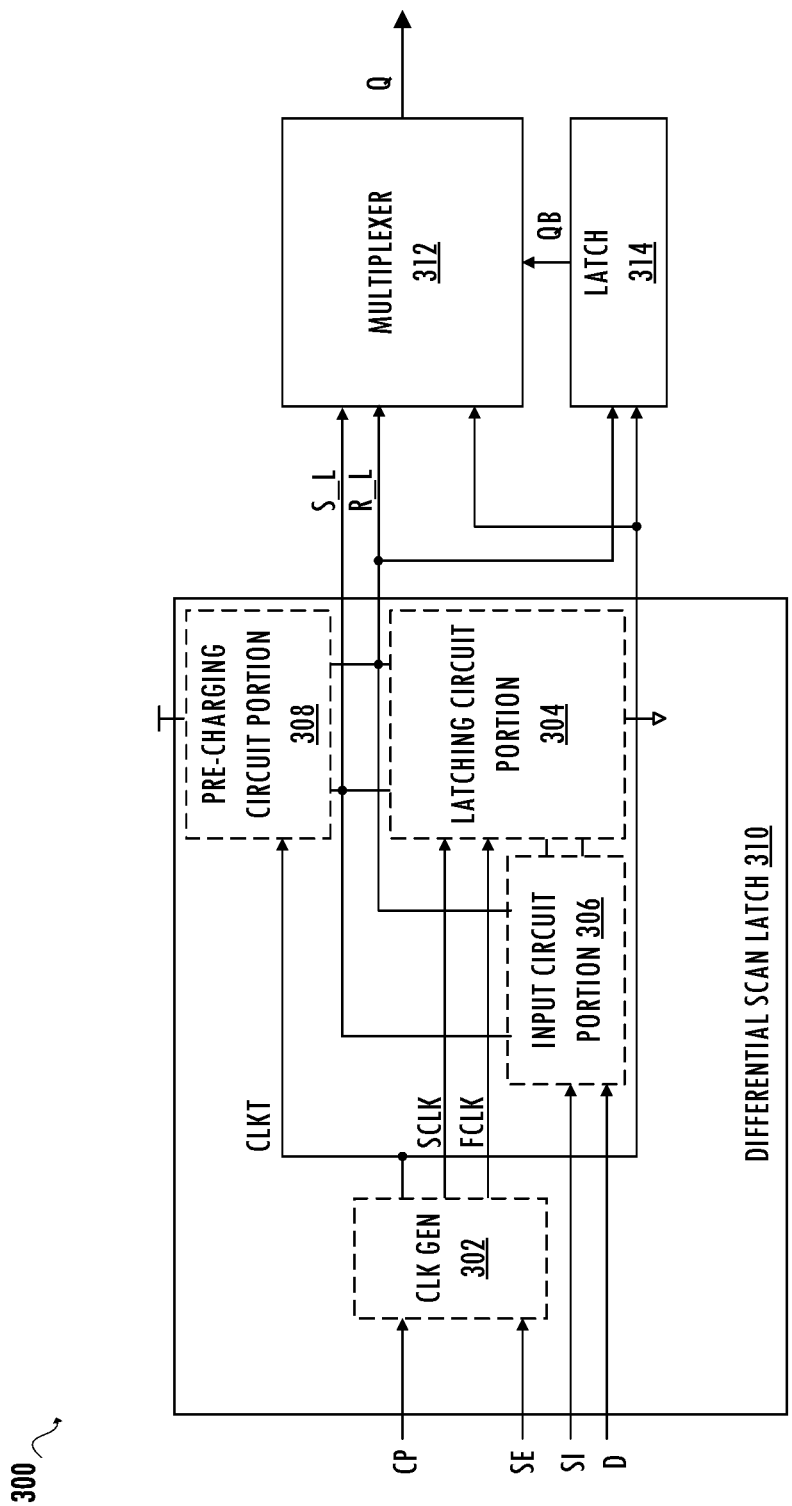
FIG. 3 illustrates a functional block diagram of a split-scan sense amplifier flip-flop consistent with at least one embodiment of the invention.
Figure 4:
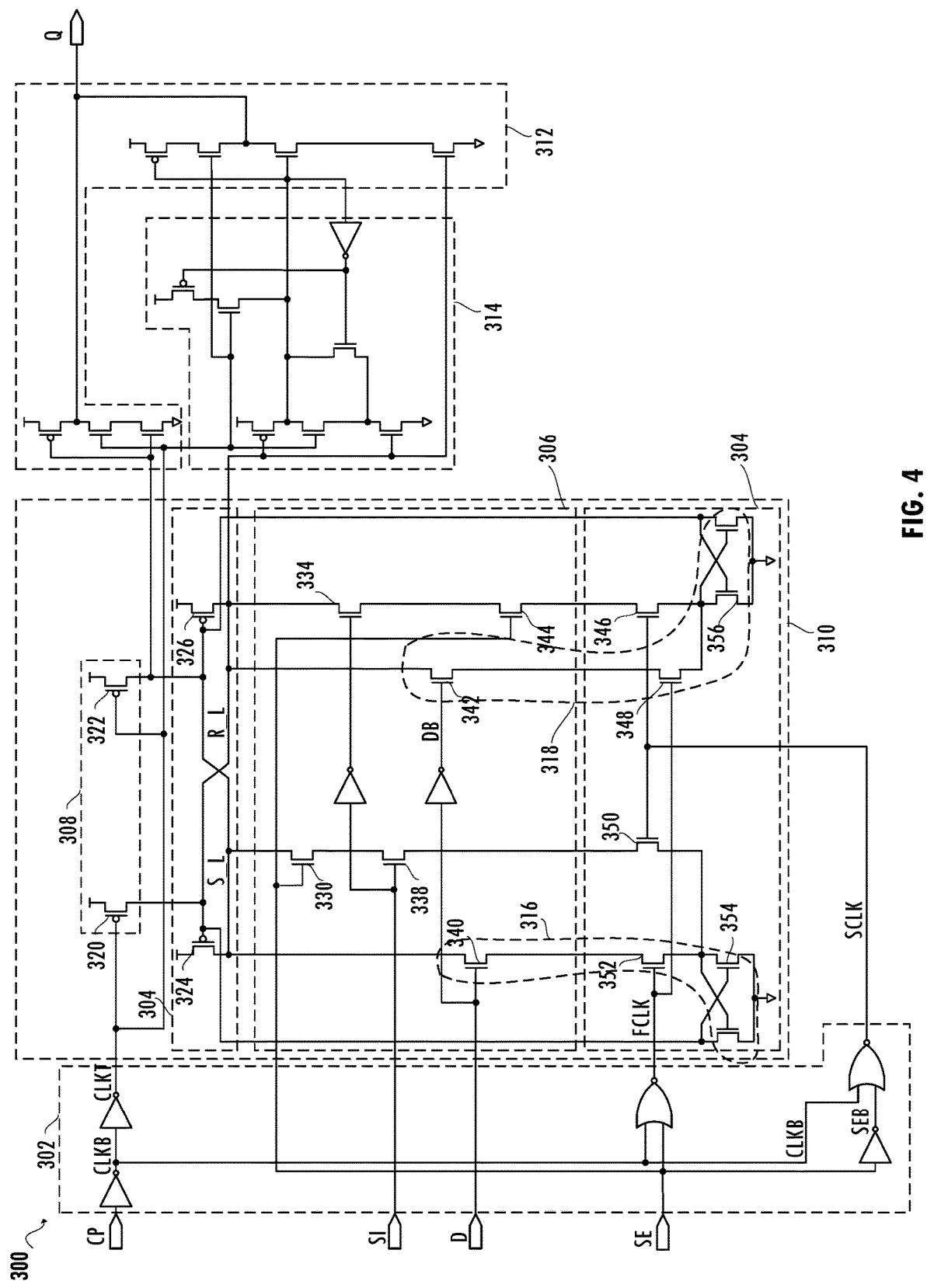
FIG. 4 illustrates an exemplary circuit diagram of the split-scan sense amplifier flip-flop of FIG. 3 consistent with at least one embodiment of the invention.

Referring to FIGS. 3 and 4, in an embodiment, split-scan sense amplifier flip-flop 300 includes latch 314, differential scan latch 310 and multiplexer 312. Differential scan latch 310 includes clock generator 302, latching circuit portion 304, input circuit portion 306, and pre-charging circuit portion 308. Pre-charging circuit portion 308 is controlled by buffered clock signal CLKT and is coupled between a power supply node (e.g., VDD) and differential pair of nodes S_L and R_L. Input circuit portion 306 receives data signal D and scan input signal SI, and is coupled to differential pair of nodes S_L and R_L. Input circuit portion 306 selectively couples one node of differential pair of nodes S_L and R_L to be discharged by latching circuit portion 304 according to scan clock signal SCLK or functional clock signal FCLK and selectively couples the other node of differential node S_L and R_L to be maintained at the pre-charged voltage according to scan clock signal SCLK or functional clock signal FCLK. Latching circuit portion 304 is controlled by scan clock signal SCLK and functional clock signal FCLK and is coupled to differential pair of nodes S_L and R_L. Latch 314, which is coupled to node R_L, updates inverted data output QB in response to delayed clock signal CLKT and provides inverted data output QB to multiplexer 312. Multiplexer 312 receives signals on differential pair of nodes S_L and R_L and provides output data signal Q in response to buffered clock signal CLKT.

Figure 5:
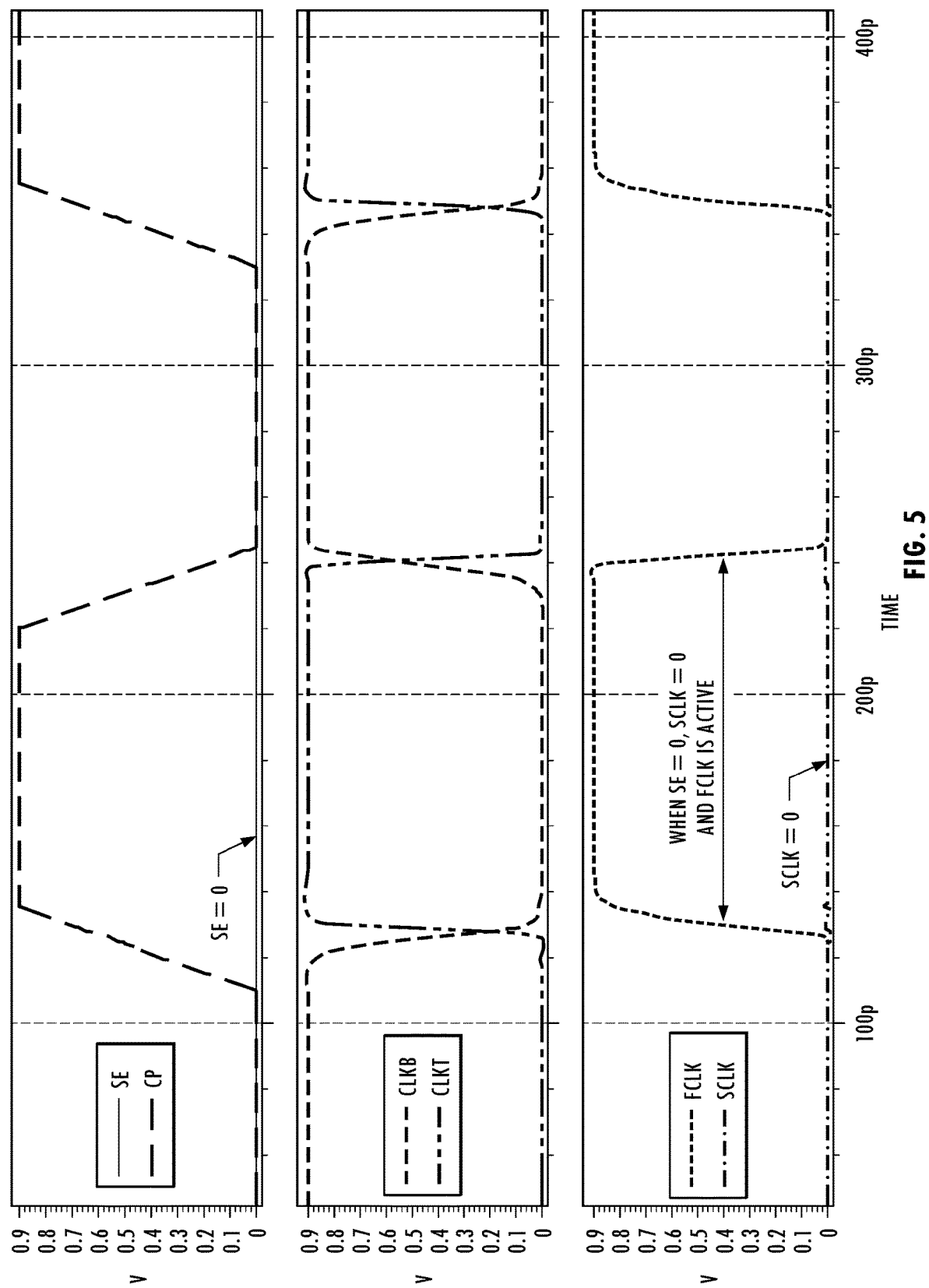
FIG. 5 illustrates timing waveforms for the split-scan sense amplifier flip-flop of FIG. 3 configured in a normal mode of operation consistent with at least one embodiment of the invention.
Figure 6:
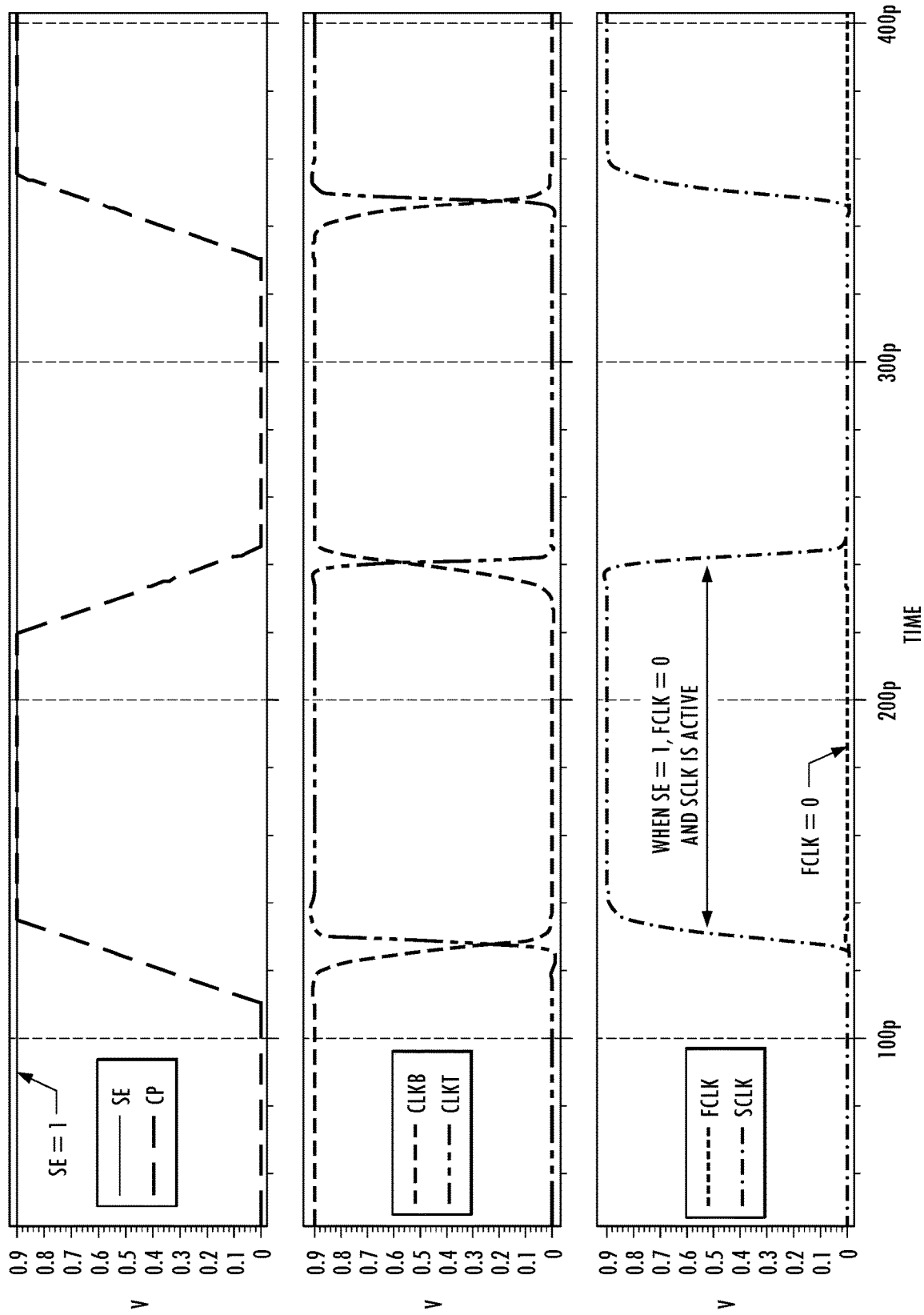
FIG. 6 illustrates timing waveforms for the split-scan sense amplifier flip-flop of FIG. 3 configured in a scan mode of operation consistent with at least one embodiment of the invention.

In at least one embodiment of split-scan sense amplifier flip-flop 300, clock generator circuit 302 generates inverted clock signal CLKB, delayed clock signal CLKT, functional clock signal FCLK, and scan clock signal SCLK based on clock signal CP and scan enable signal SE. Referring to FIG. 5, when scan mode is inactive (e.g., scan enable signal SE='0'), functional clock signal FCLK is a delayed version of clock signal CP and scan clock signal SCLK is inactive (i.e., has a predetermined, constant value, e.g., SCLK='0'). Referring to FIG. 6, when scan mode is active (e.g., SE='1'), functional clock signal FCLK is inactive (i.e., has a predetermined, constant value, e.g., FCLK='0') and scan clock signal SCLK is a delayed version of clock signal CP. Functional clock signal FCLK and scan clock signal SCLK are mutually exclusive, i.e., at any instant in time, only one of functional clock signal FCLK and scan clock signal SCLK is a periodic signal while the other has a predetermined constant value (e.g., '0').

Referring to FIG. 4, in at least one embodiment, split-scan sense amplifier flip-flop 300 includes evaluation path 316 and evaluation path 318 that each include three n-type transistors coupled in series between a power supply node (e.g., ground) and a corresponding node of the differential pair of nodes R_L and S_L. Delayed clock signal CLKT periodically enables pre-charge circuit 308 to pre-charge both nodes of the differential pair of nodes S_L and R_L. Scan mode enable SE determines whether functional clock signal FCLK or scan clock signal SCLK is active, thereby enabling a normal mode evaluation branch responsive to input data D or a scan mode evaluation branch responsive to scan input data SI, respectively. If scan mode is disabled, then functional clock signal FCLK is active. If functional clock signal FCLK is active and input data D='1,' then branch 316 discharges node S_L while node R_L stays charged. If functional clock signal FCLK is active and input data D='0,' then branch 318 discharges node R_L while node S_L stays charged. If scan mode is enabled, then scan clock signal SCLK is active. If scan clock signal SCLK is active and scan data input SI='1,' then the branch including n-type transistors 330, 338, and 350, discharges node S_L while node R_L stays charged. If scan clock signal SCLK is active and scan data input SI='0,' then the branch including transistors 334, 344, and 346 discharges node R_L while node S_L stays charged.

Referring to FIGS. 1, 3, and 4, split-scan sense amplifier flip-flop 300 has faster setup and total timing overhead than scan sense amplifier flip-flop 100. Split-scan sense amplifier flip-flop 300 internally generates mutually exclusive functional mode clock and scan mode clock to reduce the critical evaluation path to three series-coupled n-type transistors between the differential pair of nodes and a power supply node. Note that in other embodiments, a split-scan sense amplifier flip-flop includes a pre-discharge circuit of n-type transistors and normal mode evaluation paths and scan mode evaluation paths of p-type transistors that couple a differential pair of nodes to VDD, which selectively charge a node of the differential pair of nodes while the other node of the differential pair of nodes is maintained at a discharged voltage level. In at least one embodiment of split-scan sense amplifier flip-flop 300, a mode select transistor is included in each of the scan mode evaluation branches to isolate differential pair of nodes S_L and R_L from a switching scan input pin (SI), thereby improving the timing of the functional branch.

Figure 7:
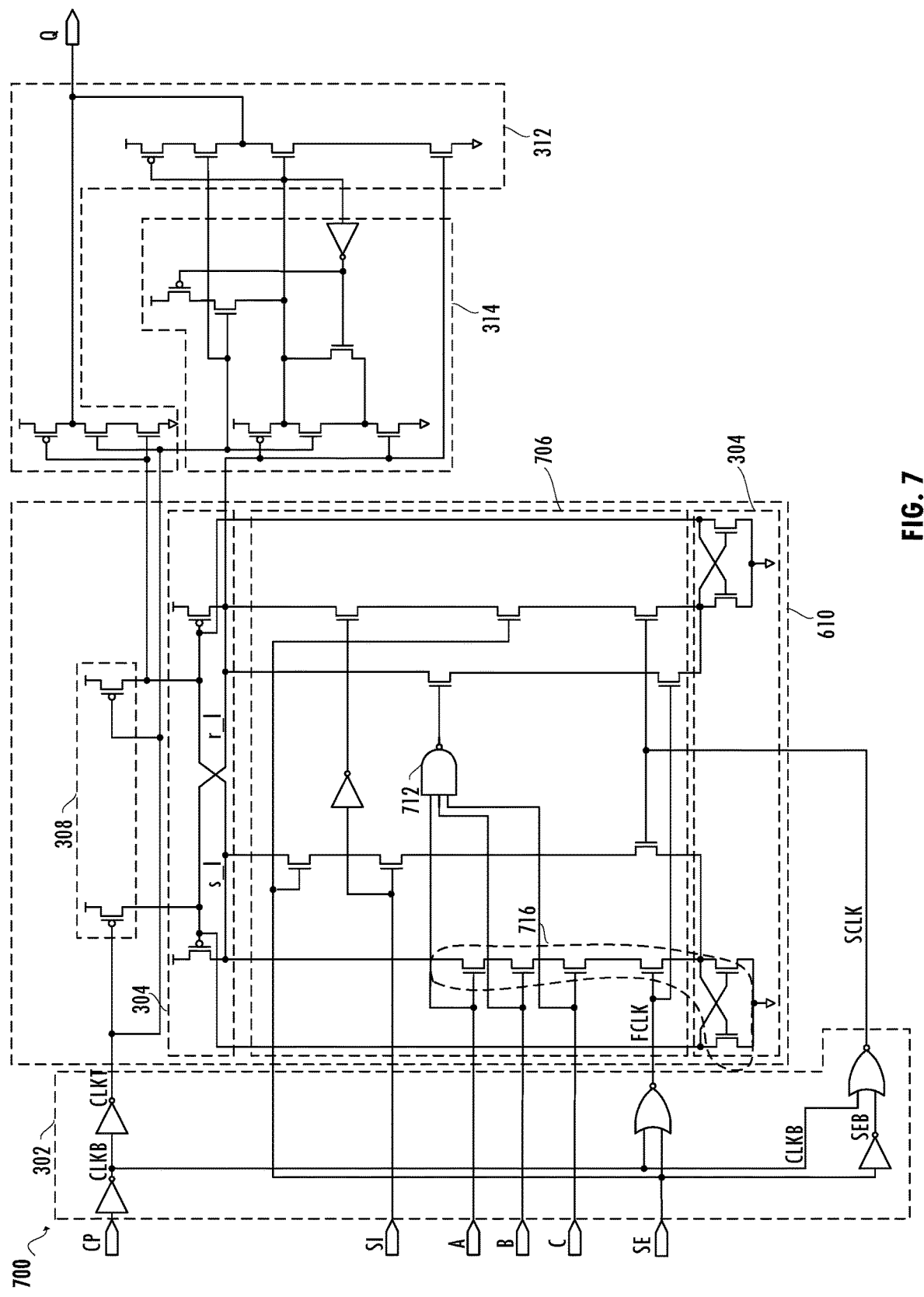
FIG. 7 illustrates an exemplary circuit diagram of a split-scan sense amplifier flip-flop integrating a three-input logic function consistent with at least one embodiment of the invention.

In at least one embodiment, a split-scan sense amplifier flip-flop is incorporated into complex logic split-scan sense amplifier flip-flops with a three-input NAND, NOR or AOI structure. Such embodiments provide physical designers with increased options for optimizing critical circuit paths. For example, referring to FIG. 7, three-input NAND and split-scan sense amplifier flip-flop 700 includes normal mode evaluation path 716 that includes five transistors coupled in series between node S_L and ground. When functional clock signal FLCK='1,' A='1,' B='1,' and C='1', then normal mode evaluation path 716 discharges node S_L to ground and the output of NAND 712 causes node R_L to maintain a pre-charged level. When functional clock signal FLCK='1' and A='0,' B='0,' or C='0,' then normal mode evaluation path 716 maintains node S_L at the pre-charged level and the output of NAND 712 equals '1' thereby causing node R_L to discharge to ground. Since a typical NAND gate includes only one transistor delay between power supply node VDD and its output, the path between node R_L and ground includes fewer than five transistors and normal mode evaluation path 716 is the critical path. In contrast, a conventional three-input NAND and scan sense amplifier flip-flop includes six transistors between node S_L and ground. Thus, three-input NAND and split-scan sense amplifier flip-flop 700 has a substantially reduced clock-to-Q delay (i.e., the time it takes for the output of the flip-flop to be in a stable state after an edge of input clock signal CP) as compared to the three input NAND scan sense amplifier flip-flop. Similar improvements are realized for a three-input NOR and split-scan sense amplifier flip-flop and a three-input AOI and split-scan sense amplifier flip-flop.

Figure 8:
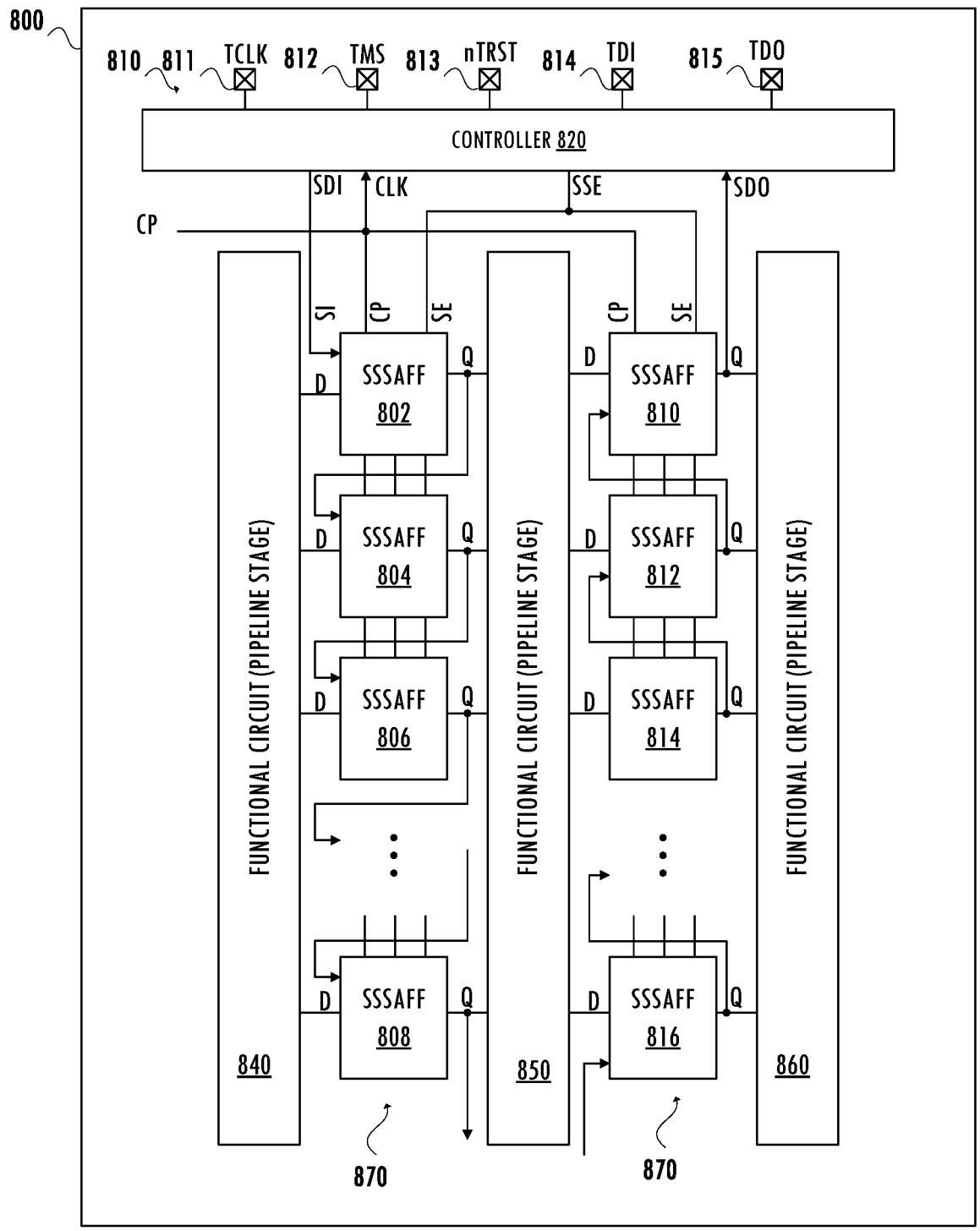
FIG. 8 illustrates a functional block diagram of a portion of a pipelined processor including a scan chain of split-scan sense amplifier flip-flops consistent with at least one embodiment of the invention.

Referring to FIG. 8, a pipelined microprocessor 800 includes scan chain 870 using split-scan sense amplifier flip-flops described above. FIG. 8 illustrates features of pipelined microprocessor 800 related to the use of split-scan sense amplifier flip-flops but does not show other features. These other features include conventional microprocessor features that are well-known to those of ordinary skill in the art. Embodiments of pipelined microprocessor 800 implement any of several known processor types, e.g., a reduced instruction set computer (RISC), a complex instruction set computer (CISC), a graphics processing unit (GPU), a digital signal processor (DSP), or a network processor. In an embodiment, pipelined microprocessor 800 includes a set of scan terminals 810, a test access port (TAP) controller 820, functional circuits 840, 850, and 860, and scan chain 870.

In at least one embodiment of pipelined microprocessor 800 scan terminals 810 are implemented as bonding pads used for communicating various signals related to the operation of TAP controller 820. Scan terminals 810 include input terminal 811 for receiving external test clock signal TCLK, input terminal 812 for receiving test mode select signal TMS, input terminal 813 for receiving an active low test reset signal nTRST, input terminal 814 for receiving test data input signal TDI, and output terminal 815 for providing test data output signal TDO. In some embodiments, TAP controller 820 has an interface compatible with the Joint Test Action Group (JTAG) standard, IEEE 1149.1. TAP controller 820 has inputs or outputs coupled to corresponding ones of scan terminals 810, an input for receiving true clock signal CLK, an input for receiving scan data output signal SDO, an output for providing scan shift enable signal SSE, and an output for providing scan data input signal SDI.

Functional circuit 840 has a set of inputs (not shown in FIG. 8), and a set of outputs for providing a set of data signals D. Functional circuit 850 has inputs for receiving respective data output signals Q, and outputs for providing respective data output signals. Functional circuit 860 has inputs for receiving respective data output signals Q, and a set of outputs (not shown in FIG. 8). In the illustrated embodiment, each of functional circuits 840, 850, and 860 correspond to a pipeline stage in pipelined microprocessor 800. In an embodiment, pipelined microprocessor 800 is a single scalar microprocessor and functional circuits 840, 850, and 860 function as decode, dispatch, and execute stages of the pipeline, respectively. In another embodiment, pipelined microprocessor 800 is a super scalar microprocessor and functional circuits 840, 850, and 860 are pipeline stages of a functional unit, e.g., a floating-point unit that is separate from other functional units.

Scan chain 870 is formed with a set of split-scan sense amplifier flip-flops SSSAFF in which the data output signal Q of one SSSAFF is received at the scan data input signal SDI of a subsequent SSSAFF, and all SSSAFFs receive a scan enable signal SE and clock signal CP. As shown in FIG. 8, scan chain 870 includes a first set of SSSAFFs including representative SSSAFF 802, 804, 806, and 808 coupled between functional circuit 840 and functional circuit 850, and with a scan path connected in series with one another as described above, as well as a second set of SSSAFFs including representative SSSAFFs 810, 812, 814, and 816 coupled between functional circuit 850 and functional circuit 860, and with a scan path coupled in series with one another as described above. The data output signal Q of SSSAFF 810 forms signal SDO at the output of scan chain 870.

Thus, techniques for reducing timing of critical paths while maintaining scan testing functionality have been disclosed. The description of the invention set forth herein is illustrative and is not intended to limit the scope of the invention as set forth in the following claims. For example, while the invention has been described in an embodiment in which the differential scan latch pre-charges a differential pair of nodes, one of skill in the art will appreciate that the teachings herein can be utilized with a differential scan latch that pre-discharges a differential pair of nodes. The terms "first," "second," "third," and so forth, as used in the claims, unless otherwise clear by context, is to distinguish between different items in the claims and does not otherwise indicate or imply any order in time, location, or quality. For example, "a first received signal," "a second received signal," does not indicate or imply that the first received signal occurs in time before the second received signal. Variations and modifications of the embodiments disclosed herein may be made based on the description set forth herein, without departing from the scope of the invention as set forth in the following claims.

What is claimed is:

1. A method comprising:
    generating a functional clock signal, a scan clock signal, and a delayed clock signal based on a control clock signal and a scan enable signal;
    precharging or predischarging a differential pair of nodes in a first latch using the delayed clock signal and a voltage on a first power supply node;
    controlling a second latch using the delayed clock signal;
    latching data by the first latch using the functional clock signal in a normal mode of operation; and
    latching scan data by the first latch using the scan clock signal in a scan mode of operation.

2. The method as recited in claim 1 wherein each normal mode evaluation path of the first latch comprises at most three transistors coupled in series between the differential pair of nodes and a second power supply node.

3. The method as recited in claim 1,
    wherein the delayed clock signal is a first delayed version of the control clock signal, the functional clock signal is a second delayed version of the control clock signal, and the scan clock signal has a first constant signal level in response to the scan enable signal being inactive, and
    wherein the delayed clock signal is the first delayed version of the control clock signal, the scan clock signal is a third delayed version of the control clock signal, and the functional clock signal has a second constant signal level in response to the scan enable signal being active.

4. The method as recited in claim 1 wherein the functional clock signal, the scan clock signal, and the delayed clock signal are synchronous and are delayed from the control clock signal by two gate delays.

5. The method as recited in claim 1 wherein generating the functional clock signal and the scan clock signal comprises logically combining the control clock signal and the scan enable signal.

6. The method as recited in claim 1 wherein the functional clock signal and the scan clock signal have mutually exclusive active phases.

7. The method as recited in claim 1 further comprising:
    isolating the differential pair of nodes from a scan input terminal.

8. The method as recited in claim 1 further comprising:
selectively providing a first signal generated by the second latch or a second signal on the differential pair of nodes to generate an output signal using the delayed clock signal.

9. A scan flip-flop comprising:
a first latch comprising:
a differential pair of nodes,
a precharge circuit portion or predischarge circuit portion coupled between the differential pair of nodes and a first power supply node and controlled by a delayed clock signal;
an input circuit portion coupled between the differential pair of nodes and a second power supply node; and
a latching circuit portion coupled between the differential pair of nodes and the second power supply node, the input circuit portion and the latching circuit portion being coupled to form normal mode evaluation paths between the differential pair of nodes and the second power supply node and responsive to a functional clock signal and an input data signal and to form scan mode evaluation paths between the differential pair of nodes and the second power supply node and responsive to a scan clock signal and a scan data input signal; and
a clock generation circuit configured to generate the functional clock signal, the scan clock signal, and the delayed clock signal based on a control clock signal and a scan enable signal.

10. The scan flip-flop as recited in claim 9 wherein each normal mode evaluation path of the normal mode evaluation paths comprises at most three transistors coupled in series between the differential pair of nodes and the second power supply node.

11. The scan flip-flop as recited in claim 9 further comprising a second latch coupled to a first node of the differential pair of nodes and configured to update an output signal in response to the delayed clock signal.

12. The scan flip-flop as recited in claim 11 further comprising a multiplexer circuit controlled by the delayed clock signal to selectively provide a first signal generated by the second latch or a second signal on the differential pair of nodes to generate an output of the scan flip-flop.

13. The scan flip-flop as recited in claim 9 wherein the functional clock signal, the scan clock signal, and the delayed clock signal are synchronous and are delayed from the control clock signal by two gate delays.

14. The scan flip-flop as recited in claim 9 wherein generating the functional clock signal and the scan clock signal comprises logically combining the control clock signal and the scan enable signal.

15. The scan flip-flop as recited in claim 9 wherein the functional clock signal and the scan clock signal have mutually exclusive active phases.

16. The scan flip-flop as recited in claim 9 wherein each scan mode evaluation path of the scan mode evaluation paths comprises an isolation transistor coupled between a corresponding node of the differential pair of nodes and a scan input terminal.

17. The scan flip-flop as recited in claim 9 wherein the scan flip-flop implements a three-input logic function and each normal mode evaluation path of the normal mode evaluation paths comprises at most five transistors coupled in series between the differential pair of nodes and the second power supply node.

18. The scan flip-flop as recited in claim 17 wherein the three-input logic function is a NAND logic function.

19. A processor comprising:
a first functional circuit;
a second functional circuit;
a scan chain coupled to an output of the first functional circuit and to an input of the second functional circuit, each scan flip-flop of the scan chain comprising:
a first latch circuit comprising:
a differential pair of nodes,
a precharge circuit portion or a predischarge circuit portion coupled between the differential pair of nodes and a first power supply node and controlled by a delayed clock signal;
an input circuit portion coupled between the differential pair of nodes and a second power supply node; and
a latching circuit portion coupled between the differential pair of nodes and the second power supply node, the input circuit portion and the latching circuit portion being coupled to form normal mode evaluation paths between the differential pair of nodes and the second power supply node and responsive to a functional clock signal and an input data signal and to form scan mode evaluation paths between the differential pair of nodes and the second power supply node and responsive to a scan clock signal and a scan data input signal,
wherein each normal mode evaluation path of the normal mode evaluation paths comprises at most three transistors coupled in series between the differential pair of nodes and the second power supply node.

20. The processor as recited in claim 19,
wherein each scan flip-flop of the scan chain further comprises a clock generation circuit configured to generate the functional clock signal, the scan clock signal, and the delayed clock signal,
wherein the delayed clock signal is a first delayed version of a control clock signal, the functional clock signal is a second delayed version of the control clock signal, and the scan clock signal has a first constant signal level in response to the scan enable signal being inactive, and
wherein the delayed clock signal is the first delayed version of the control clock signal, the scan clock signal is a third delayed version of the control clock signal, and the functional clock signal has a second constant signal level in response to the scan enable signal being active.

* * * * *